United States Patent
Williams et al.

(10) Patent No.: US 9,331,673 B2
(45) Date of Patent: May 3, 2016

(54) INTEGRATED CIRCUIT OPERATING ACTIVE CIRCUITRY AND CHIP PADS IN DIFFERENT OPERATING MODES AND AT DIFFERENT VOLTAGE LEVELS

(71) Applicant: QUALCOMM TECHNOLOGIES INTERNATIONAL, LTD., Cambridge (GB)

(72) Inventors: Peter Andrew Rees Williams, Cambridge (GB); Barnaby Golder, Ely (GB)

(73) Assignee: Qualcomm Technologies International, Ltd., Cambridge (GB)

( * ) Notice: Subject to any disclaimer, the term of this patent is extended or adjusted under 35 U.S.C. 154(b) by 195 days.

(21) Appl. No.: 14/144,759

(22) Filed: Dec. 31, 2013

(65) Prior Publication Data

US 2015/0188517 A1   Jul. 2, 2015

(51) Int. Cl.
    *H03K 3/012*      (2006.01)
    *H03K 19/0175*   (2006.01)
    *H03K 3/037*      (2006.01)

(52) U.S. Cl.
    CPC ............ *H03K 3/012* (2013.01); *H03K 19/0175* (2013.01); *H03K 3/037* (2013.01)

(58) Field of Classification Search
    CPC .................................................. G01R 31/31701
    USPC ......................................................... 714/724
    See application file for complete search history.

(56) References Cited

U.S. PATENT DOCUMENTS

| | | | |
|---|---|---|---|
| 5,017,813 A | 5/1991 | Galbraith et al. | |
| 5,896,044 A | 4/1999 | Walden | |
| 6,366,124 B1 | 4/2002 | Kwong | |
| 7,148,735 B2 | 12/2006 | Ito et al. | |
| 7,714,612 B1 | 5/2010 | Pertijs | |
| 7,827,427 B2 | 11/2010 | Lee et al. | |
| 7,904,838 B2 | 3/2011 | Balatsos et al. | |
| 8,085,065 B2 | 12/2011 | Zhang | |
| 8,516,288 B2 | 8/2013 | Kondo | |
| 2003/0214845 A1* | 11/2003 | Yamazaki | G11C 29/1201 365/189.04 |

FOREIGN PATENT DOCUMENTS

| | | |
|---|---|---|
| EP | 1 098 239 A1 | 5/2001 |
| JP | 2008 059300 A | 2/2008 |
| WO | 9429963 A1 | 12/1994 |

OTHER PUBLICATIONS

GB Search Report issued in related GB Application No. 1414032.1, dated Feb. 5, 2015.
Search Report, dated Aug. 27, 2015, issued in related application GB1414032.1.

* cited by examiner

*Primary Examiner* — Fritz Alphonse
(74) *Attorney, Agent, or Firm* — Procopio, Cory, Hargreaves & Savitch LLP

(57) ABSTRACT

An integrated circuit having an external connection pad and an active circuit for generating signals to be output from the integrated circuit by means of the pad, the integrated circuit including an interface circuit associated with the pad, the interface circuit including a latch coupled between the pad and an output of the active circuit, the latch being capable of operating in a first mode in which the state of the pad follows the state of the output of the active circuit and a second mode in which the state of the pad is held by the latch.

15 Claims, 3 Drawing Sheets

INTEGRATED CIRCUIT OPERATING ACTIVE CIRCUITRY AND CHIP PADS IN DIFFERENT OPERATING MODES AND AT DIFFERENT VOLTAGE LEVELS

BACKGROUND TO THE INVENTION

This invention relates to chip pads, and in particular to circuitry associated with chip pads.

FIG. 1 is a schematic diagram of an integrated circuit (IC). The IC is formed as a set of electrical components on a semiconductor die 1. The components include a main processing section of active components 2. Around the periphery of the die is a set of bonding pads 3, known collectively as a pad ring. The bonding pads serve to allow the die to be connected to other devices. For example, when the die is packaged, wire bond connections may be made from the pads 3 to solder pads on the exterior of the package. Those solder pads may then be soldered or clamped to a circuit board.

Each bonding pad 3 has interface circuitry 4 located between it and the active components 2. FIG. 2 shows a simple example of the form the interface circuitry may take. In this example the interface circuitry 4 provides electrostatic discharge (ESD) protection and level shifting. Diodes 5, 6 are arranged between the pad 3 and voltage supply rail 7 and ground 8. They resist ESD interference being passed to the line 10 that connects the pad to the active components 2. A level shifter 9 converts between the voltage level used to represent "high" in the domain of the active circuitry 2 and the voltage level used to represent "high" in the domain of the pads. In this example the voltage level used to represent "high" in the domain of the active circuitry is slightly lower than the voltage level used to represent "high" in the domain of the pads, so for output signals the level shifter converts a "high" signal input from the active components 2 into a slightly higher voltage that will be passed to the pad 3, and for input signals the level shifter converts a "high" signal input from the pad 3 into a slightly lower voltage that will be passed to the active components 2.

One trend in modern IC design is to drastically reduce the power consumption of ICs. One way to reduce power is to divide the IC into a set of power domains. A power domain is a set of components on the IC that can together be placed in a low power mode independently of the other components on the IC. Dividing the IC into multiple power domains allows parts of the IC that are not being used to be powered down, so that they are using little or no power, whilst other parts of the IC continue to function. Normally the IC will be equipped with a power controller which determines which power domains need to be turned on to satisfy the current requirements on the IC, and arranges for the other power domains on the IC to be powered down.

The IC might be intended to generate outputs that will be read by other devices. Those outputs will be presented as high or low voltages, representing binary ones or zeros, at its output pads. The state of an output pad will be determined by active circuitry on the IC. That active circuitry will generate a logical output, and the appropriate output pad will be set to high or low accordingly.

Once the active circuitry has generated the logical output, e.g. at point 10 in FIGS. 1 and 2, the active circuitry has completed its task. Assuming no more work is required of the active circuitry, the active circuitry could in principle be powered down to reduce energy consumption. However, if the chip pad has a simple driver circuit as shown in FIG. 2, if the active circuitry is powered down then the pad will no longer carry an output, or could revert to a default state. It is generally not known when the external device that is intended to consume the output has actually read the state of the pad. Therefore, it is normally desirable to keep the active circuitry powered up for some time after it has completed its processing, just to maintain an output at a pad that can at some stage be accessed by a consumer of that output. Keeping the active circuitry alive in that way consumes power that could otherwise be saved.

One way to address this is to make the entire pad ring, including those latch circuits, a separate power domain from the active circuitry, and to provide a buffer as part of that power domain into which the pad state can be written when the active circuitry is to be shut down. This provides advantages over keeping the active circuitry powered up, but the requirement to store the pad state into the buffer increases the time taken to power down the active circuitry, and it can be complex to lay out the IC to that the buffer can communicate with the pads and share their power domain.

SUMMARY OF THE INVENTION

According to the present invention there is provided an integrated circuit having an external connection pad and an active circuit for generating signals to be output from the integrated circuit by means of the pad, the integrated circuit comprising an interface circuit associated with the pad, the interface circuit comprising a latch coupled between the pad and an output of the active circuit, the latch being capable of operating in a first mode in which the state of the pad follows the state of the output of the active circuit and a second mode in which the state of the pad is held by the latch.

The integrated circuit may have a plurality of pads. The integrated circuit may have a plurality of interface circuits. Each interface circuit may be associated with a respective one of the pads. Each interface circuit may be located adjacent to the pad with which it is associated.

The interface circuits may be comprised in a common power domain with each other. The active circuit may be comprised in a second power domain different from the common power domain.

The interface circuit may be arranged so that in the second mode the state of the pad is independent of the state of the output of the active circuit.

The latch may have a state input. The latch may have a state output. The latch may have a latch enable input. The latch may be arranged to: when the latch enable input is in a first state, output at the state output a signal that represents the current value of the state input; and when the latch enable input is a second state, output at the state output a signal that represents the value of the state input when the latch enable input last entered the second state; and the state input is connected to the output of the active circuit and the state output is connected to the pad.

The integrated circuit may be arranged to maintain the latch enable input in the first state when the active circuit is operational, and to maintain the latch enable input in the second state when the active circuit is non-operational.

The integrated circuit may be arranged to, when the active circuit is transitioning from an operational condition to a non-operational condition, change the latch enable input from the first state to the second state whilst the output of the active circuit remains valid.

The interface circuit may comprise a connection between the pad and the active circuit whereby the active circuit can read the state of the pad.

The active circuit may be capable of adopting an operational condition and a non-operational condition, and the active circuit is configured to: on transitioning from the operational condition to the non-operational condition, write at least a part of its operational state to the pad; and on transitioning from the non-operational condition to the operational condition, read the state of the pad and configure its operational state in dependence on the state of the pad.

The latch may be capable of storing only a single bit. Alternatively the latch may be capable of storing multiple data bits. The latch may be a single latching circuit that can store multiple data bits. Alternatively the latch may comprise multiple latching circuits.

The integrated circuit may be capable of putting the active circuit in a low power state in which it is inactive whilst the latch remains powered so as to hold the state of the pad.

The integrated circuit may be capable of putting the active circuit in a low power state in which it is inactive whilst the latch remains powered so as to hold its state without driving the pad.

The active circuit may signal over a first voltage range and the pad signals over a second voltage range, and the interface circuit comprises a level shifter for converting between the first and second voltage ranges, the level shifter being capable of converting a signal at a first extreme of the first range to a signal at a first extreme of the second range irrespective of whether the first extreme of the first range is higher or lower than the first extreme of the second range.

According to a second aspect of the present invention there is provided an integrated circuit having an external connection pad and an active circuit for generating signals to be output from the integrated circuit by means of the pad, the integrated circuit comprising an interface circuit associated with the pad, the active circuit signalling over a first voltage range and the pad signalling over at a second voltage range, and the integrated circuit comprising an interface circuit associated with the pad, the interface circuit comprising a level shifter for converting between the first and second voltage ranges, the level shifter being capable of converting a signal at a first extreme of the first range to a signal at a first extreme of the second range irrespective of whether the first extreme of the first range is higher or lower than the first extreme of the second range.

The integrated circuit may comprises a switch that receives a supply voltage of the active circuit and a supply voltage of the pad, the switch being configured to provide the higher of those voltages to the interface circuit as a supply voltage of the interface circuit. The switch could be a multiplexer. The switch could receive other voltages in addition to or instead of one or both of the supply voltage of the active circuit and the supply voltage of the pad. The switch could provide to the interface circuit a selected one of two or more voltages selected from the group comprising the supply voltage of the active circuit, the supply voltage of the pad, a battery voltage supplied to the integrated circuit and an analogue supply voltage.

DESCRIPTION OF DRAWINGS

The present invention will be described by way of example with reference to the accompanying drawings. In the drawings.

DETAILED DESCRIPTION OF THE INVENTION

Figure 1:
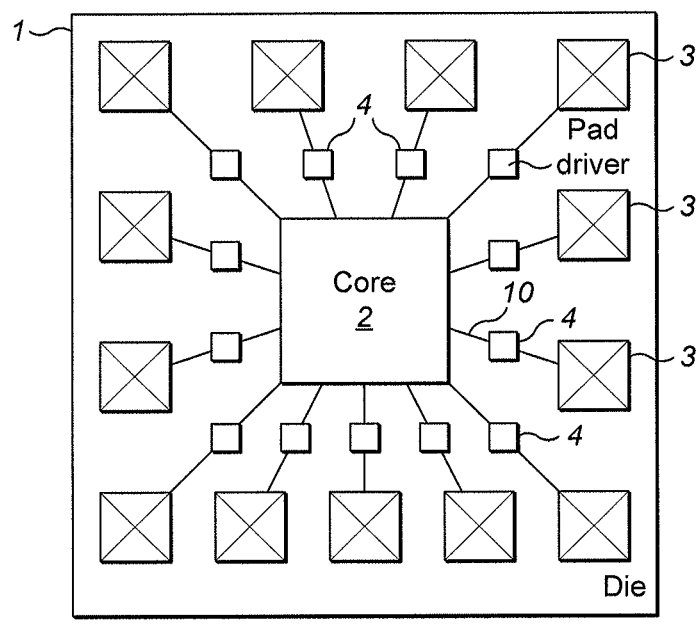
FIG. 1 shows an integrated circuit on a die.
Figure 2:
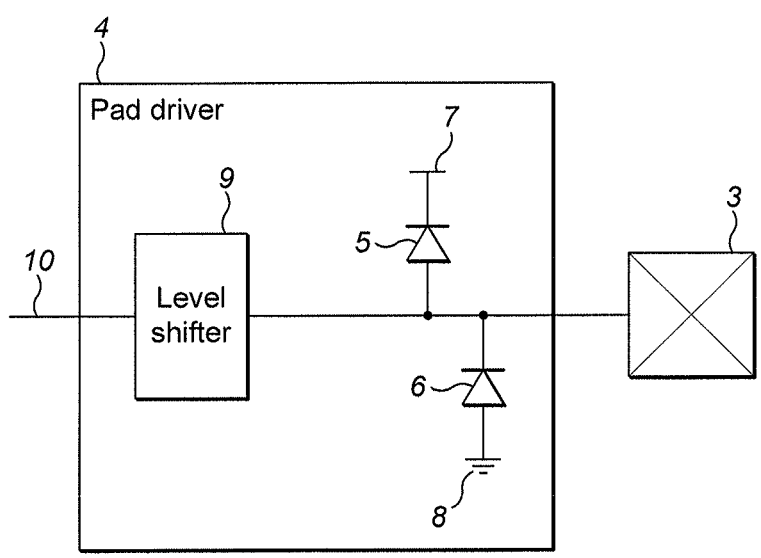
FIG. 2 shows a simple chip pad circuit.
Figure 3:
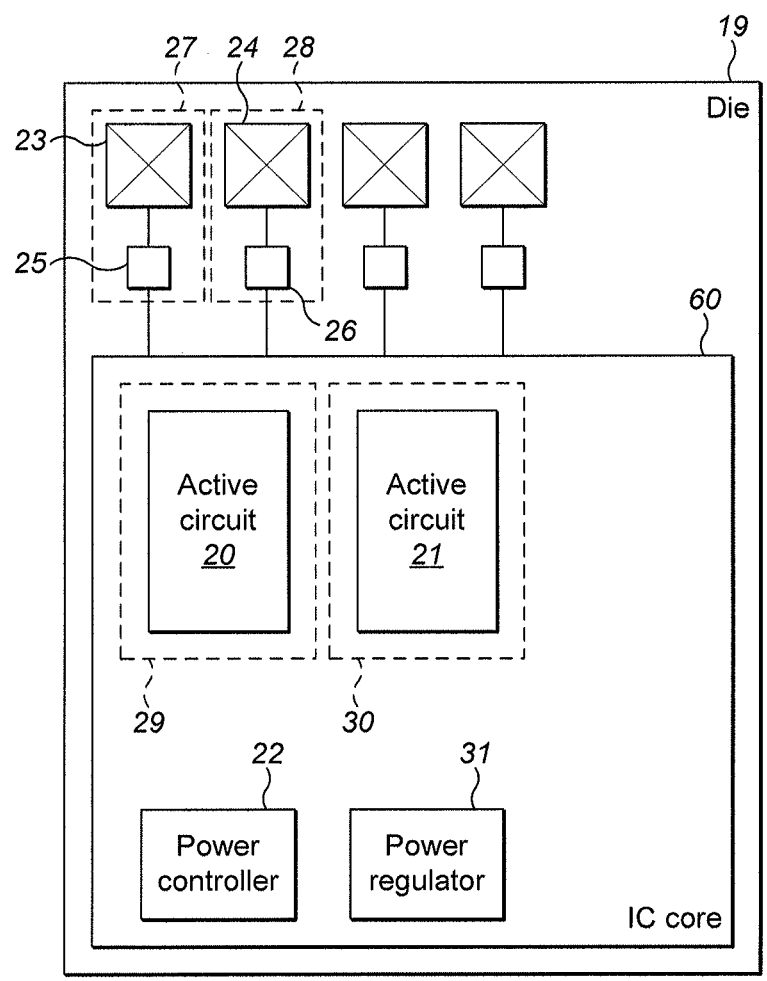
FIG. 3 shows an integrated circuit having another chip pad circuit.

FIG. 3 shows an integrated circuit implemented on a semiconductor die 19. The integrated circuit comprises active circuitry 20, 21, a power controller 22, bonding pads 23, 24 and pad drivers 25, 26. The active circuitry and the power controller are comprised in an IC core 60. Each pad has a respective pad driver by means of which it interfaces to the active circuitry of the IC. FIG. 3 illustrates power domains 27-30 on the IC. The power controller can cause each power domain to enter a low power state or an active state independently of the state of any of the other power domains. The IC may have pads that are not equipped with pad drivers, or are only equipped with simplified pad drivers: for example the pads that provide the primary voltage supply and ground to the chip. At least some of the pad drivers are capable of latching the state of a pad. This allows an output signal to be held on a pad by circuitry local to the pad. Furthermore, the IC core 60 may be capable of storing some or all of its state at the pads, and then powering down one or more parts of the core that had made use of that state. Subsequently, during a power-up operation of that or those parts the state may be read back into the IC core from the pads and used to permit that or those parts to revert to their previous state.

Each pad driver 25, 26 may be contained in a respective power domain 27, 28 independent of the other power domains on the IC. That means that the power controller can enable the state of any of the pads to be maintained independently of whether the state of any of the other pads or any of the components in the IC core 60 can be maintained. In that way, the IC can save power by maintaining the state of only those pads that are required to be kept alive, e.g. for asynchronous reads by equipment external to the IC. Alternatively, multiple ones of the pads 23, 24 and their drivers 25, 26 may be in a common power domain. As with the individual power domains, that common power domain may be capable of being maintained when the IC core 60 is powered down and not functioning. If desired, all of the pads could be comprised in a common power domain. For clarity only some of the power domains of the pads are shown in FIG. 3.

In more detail, the semiconductor die 19 of FIG. 3 is a monolithic block of semiconductor material such as silicon. The circuitry may be formed on it by processes including doping and deposition of electrically conductive material. To form a finished device the die may be packaged in a block of insulating material. The package may have exterior connectors for soldering or clamping to connectors on a circuit board. The exterior connectors of the package could, for example, be of the flat package (e.g. QFP) or grid array (e.g. BGA) type. Within the package, wire bonds or other types of conductive lead could connect the package's exterior connectors to the die's bonding pads 23, 24. Other packaging techniques, such as chip scale packaging (CSP), including wafer level chip scale packaging (WLCSP), could be used.

The active circuitry 20, 21 could perform any suitable function. For example, each active circuit could independently implement any one or more of memory, a microprocessor, a state machine, signal processing circuitry, a clock, an amplifier, an oscillator and/or a filter. The components that provide one of the active circuits could be arranged contiguously on the die, or could be arranged in two or more distinct contiguous groups that are nevertheless implemented as part of a single power domain.

The power controller 22 receives signals from the active components 20, 21 and/or the pads 23, 24 which indicate the state of the IC. For example the signals could indicate a time (as received from an active component that is a clock or as received via the pads from an external timing source), a demand for a certain process to be performed, or that a certain process has been completed. The power controller is configured to determine, based on those inputs whether to power up or power down any of the power domains on the IC. The power controller could be configured as a hardware state machine and/or as a microprocessor that executes software stored on the die in non-transient form.

Figure 4:
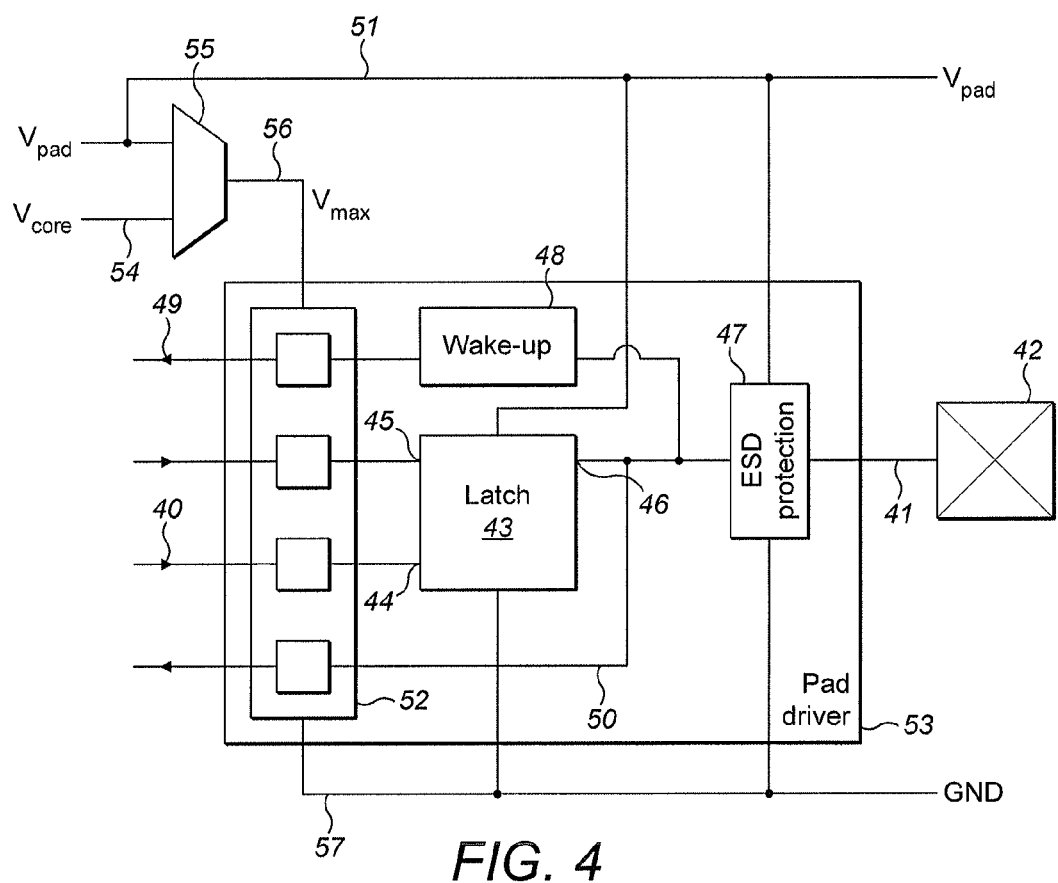
FIG. 4 shows a pad driver circuit.

FIG. 4 shows a pad driver 53. The pad driver comprises a data connection 40 to the IC's core. The pad driver has a connection 41 to its pad 42. The pad 42 is a region of electrically conductive material exposed on the exterior of the die. The pad driver has a latch 43. The latch has a state input 44, a latch enable input 45 and a state output 46. The latch is arranged so that when the latch enable input is asserted the voltage of the state output follows the voltage of the state input, but when the latch input is de-asserted the latch holds the value of the state output at the value of the state input immediately before the latch input was de-asserted. The state input and the latch enable input are connected to the IC core. The state output is connected via ESD protection 47 to the pad 42.

Active circuitry of the IC (e.g. circuitry 20 of FIG. 3) may use the pad driver shown in FIG. 4 to provide an output to a consumer device external to the die. When that active circuitry is operational it asserts the latch enable input 45 and imposes appropriate values on the state input 44 depending on what it wants to signal to the consumer. When the active circuitry is signalled to power down by the power controller 22 it performs a predefined power down sequence. That sequence involves de-asserting the latch enable input 45 whilst the state input 44 is held at a value that is to be output to the external consumer. That causes the latch to hold that value. The sequence further comprises subsequently letting the state input float, for example as a result of power being withdrawn from some or all of the active circuitry. Whilst the pad's power domain remains powered up the pad will retain the output value even though the independent power domain of the active circuitry is powered down. It should be noted that since the output signal passes to latch 43 even when the active circuitry is not being powered down, there is no need for the active circuitry to perform an additional operation of writing the output value to a store as part of its power down routine. It simply needs to de-assert the latch enable bit before it lets the state input float. Thus compared to other methods, using the latch 43 reduces the time needed for the active circuit to power down.

The latch 43 may have configuration inputs such as a polarity input and an enable input. These can also be latched at the same time as the state of input 44 is latched, in dependence on the state of line 45.

In the example of FIG. 4 the latch receives its state input from the IC core and provides its state output to the pad. That makes the pad suitable for holding an output to a consumer off the IC. The latch could alternatively be configured to receive its state input from the pad and provide its state output to the IC core. That would make the pad suitable for holding an input to the IC. In the latter case the latch enable input could be asserted continuously, or whilst a consumer in the IC core is powered down, or from externally to the IC via another pad on the chip. Alternatively the pad might be used to receive inputs from off the die without latching them. Such inputs can be read by the IC core using line 50. A single pad could be capable of operating in multiple modes as required. Each pad may serve as an input pad, an output pad or an input/output pad.

One way to permit a pad to be used as both an input and an output pad is to arrange for the output signal from the latch to be capable of operating in tristate. This can be achieved by having a second latch located between latch 43 and the connection of input sensing line 50 to the pad. The second latch can disconnect the output of latch 43 from that connection so that the pad can adopt a voltage independently of the state of latch 43. Latch 43 will continue to hold a value when it is disconnected by the second latch. The second latch could operate under the control of the active circuit.

The pad driver circuit for a pad capable of receiving input from an external source could include a wake-up circuit, as shown at 48 in FIG. 4. The wake-up circuit receives an input from the pad 42. The wake-up circuit is configured so that when the pad is taken to a predetermined value, e.g. high, the wake-up circuit provides an output 49 to the power controller. The power controller is configured to respond to that input by powering up one or more of the power domains on the IC. Alternatively, the wake-up circuit could provide an output to one or more of the domains that causes them to power up directly. In the latter case the power controller itself could remain powered down. The presence of the wake-up circuit 48 means that when the pad driver is powered up, other parts of the IC can be powered down and then re-enabled by means of a signal from the pad. For example, all the IC core could be powered down, and at least one of the pad drivers left powered. Then some or all of the IC core could boot up when that pad is signalled from off the IC. This arrangement allows the IC to have a very low level of quiescent power consumption but still be re-activated when required, The pad drive could be capable of being put into a low power mode in which the latch retains its state but does not drive the pad. To achieve this the latch could be provided with an output driver. The output driver senses the state of the latch's output and drives the pad in dependence on that output with a higher current than the latch itself can provide. The output driver could, for example, be a transistor. The latch is supplied by one power rail and the output driver is supplied by another power rail. The power rail that supplies the output driver could be capable of being disabled independently of the power rail that supplies the latch. In a first operating mode both the latch and the output driver are enabled so that the pad is driven in dependence on the state of the latch. In a second operating mode latch is supplied with power but the output driver is not. In this mode the latch holds its state but the pad is not driven. The second mode uses less power than the first mode.

An active circuit on the IC may be configured to read the value of one or more of the pads. This may be done by means of reading connection 50 from the pad to the IC core (see FIG. 4), or in other ways. This facility allows the pads to be used to store the state of the active circuitry, and for that state to be subsequently recalled by the IC core. An active circuit of the IC core may be configured to store data bits that represent its current state on to pads of the chip during the active circuitry's power down sequence. It can do that by writing one data bit to each of a number of pads as if that data were to be output from the IC. Having done that, the active circuitry may enter a low power consumption, inactive condition. In that condition the active circuitry may be incapable of storing its own state. The active circuitry may later be powered back up. The active circuitry can be configured to, as part of its power up sequence, read the values of the same pad(s) on which it stored one or more values during the power down sequence, and to populate its state in dependence on that/those values. It can read those values by making a query of latch 43, either directly or via line 50. That allows the active circuitry to, in effect, store its state whilst powered down, by relying on the IC pads to hold data representing the state. In its powered up condition the active circuitry could hold its state in one or more registers. During its power down process it could populate bonding pads with the data bits stored by some or all of those registers. Then during its power up process it could populate some or all of the registers with data bits read from the pads.

As discussed above, the wake circuitry 48 could be configured to wake active circuitry in response to detecting a predetermined event on a pad. Alternatively, the wake circuitry could be configured to store data indicating that an event has occurred (e.g. that a pad has undergone a transition from high to low, or a transition from low to high, or an analogue voltage change from one side of a predetermined threshold voltage to another) without waking active circuitry. Then when the active circuitry is eventually woken up it can interrogate the wake circuitry associated with one or more of the pads to ascertain whether any of those events has happened. The wake circuitry could then be reset so as to be able to indicate whether such an event is detected subsequently.

It is convenient for the pad driver circuit for each pad, for example the latch and/or the ESD protection for that pad, to be implemented at a location on the die that is local to, and most preferably adjacent to that pad. Implementing the latch 43 next to each pad instead of at a remote location on the IC makes it easier to lay out the IC.

The pad driver circuit for each pad could be implemented as an individual power domain that can be powered down if required by the power controller. Alternatively, all the pad driver circuits of the IC could be comprised in a common power domain that can be powered down if required by the power controller. The pad driver circuits of some or all of the pad could be arranged so that they are always powered continuously whilst the IC is operational. To achieve that, the power rail 51 ($V_{PAD}$) from which the pads are supplied could be driven uninterruptably from the IC's primary voltage supply rail as received from a voltage supply input pad on the die.

Another function of the pad driver can be to convert between voltage levels in the domain of the pads and the domain of the IC core. The voltage presented to the exterior of the IC by the pads when set high is determined by the level of the $V_{PAD}$ power rail 51 that serves the pads. It may, for example, be at 0.8V, 1.5V or 3.6V, depending on the application. The voltage used by the IC core will be set depending on the functions it is to perform but could, for example be from 0.8V to 1.5V. The IC core's voltage is provided by power rail 54 ($V_{CORE}$). The IC may contain a power regulator 31 (FIG. 3) which receives a voltage from off the IC and steps that voltage up and/or down to generate supply voltages for the IC core and the pads. The pad driver contains a level shifter 52 which interfaces between the remainder of the pad driver and the IC core. The level shifter shifts the voltage level of signals passing between the IC core and the pad so that a signal representing a "high" voltage has the appropriate value in the appropriate domain. For example, if the IC core is operating at 0.8V and the pad is operating at 1.5V then the level shifter will convert a high state input signal of 0.8V coming from the IC core into a signal at 1.5V that will be presented to the latch 43. The voltage ranges at which the IC core and the pads can operate are such that the pads may be above or below the IC core. For example, the IC core could operate at 1.0V and the pads could operate at either 0.8V or 1.5V. To accommodate both these modes the level shifter is capable of converting a high input from the IC core either up or down. In many conventional circuits the IC core always operates below the level of the pads, so in such circuits there is only a need to step up a signal going from the IC core to the pads, and to step down a signal going from the pads to the IC core: not a need to step signals in either direction up or down. The level shifter 52 is driven from a $V_{MAX}$ rail 56. The $V_{MAX}$ rail is set by multiplexer 55 to the voltage of the higher of $V_{PAD}$ and $V_{CORE}$. The level shifter can then generate appropriate voltages between $V_{MAX}$ and ground (GND, 57), including the lower of $V_{PAD}$ and $V_{CORE}$, by means of a step down mechanism such as a potential divider.

As an example of the operation of power controller 22, active component 20 could be a clock and active component 21 could be a radio receiver that checks for the presence of a radio signal of a predetermined type and signals the result of that check as a high or low signal on pad 23. Pad 24 could be used to signal another result from the die. The power controller could be configured to perform the check for a radio signal at a predetermined interval, for example every 10 minutes. The clock's power domain is powered up continuously so that it can continue counting, and initially the power domains of the radio receiver and pad 24 are powered down whilst the power domain of pad 23 is powered up. When the clock indicates to the power controller that the predetermined interval has elapsed since the last check, the power controller powers up the radio receiver. The radio receiver performs the check and signals the output to pad 23, which latches the output signal. The radio receiver signals to the power controller that the check is complete. Then the power controller powers down the radio receiver whilst the power domain of pad 23 remains powered up. Now only the clock and pad 23—together with the power controller—are powered, but the output of the check performed by the radio receiver is available to be read from pad 23 by an external component.

In the examples discussed above the pads are arranged in a ring around the periphery of the die. The pads could be arranged in other ways. For example some or all of the pads might be located at the periphery of the die but the arrangement of pads might not extend all the way around the die. Some or all of the pads could be located so as to be spaced from the periphery of the die.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An integrated circuit comprising:
   an external connection pad;
   an active circuit for generating signals to be output from the integrated circuit by means of the pad; and
   an interface circuit associated with the pad, the interface circuit comprising a latch coupled between the pad and an output of the active circuit, the latch being capable of operating in a first mode in which the state of the pad follows the state of the output of the active circuit and a second mode in which the state of the pad is held by the latch.

2. An integrated circuit as claimed in claim 1, further comprising a plurality of pads and a plurality of interface circuits, each interface circuit being associated with a respective one of the pads and being located adjacent to the pad with which it is associated.

3. An integrated circuit as claimed in claim 1, further comprising a plurality of pads and a plurality of interface circuits, each interface circuit being associated with a respective one of the pads, the interface circuits being comprised in a common power domain with each other and the active circuit being comprised in a second power domain different from the common power domain.

4. An integrated circuit as claimed in claim 1, wherein the interface circuit is arranged so that in the second mode the state of the pad is independent of the state of the output of the active circuit.

5. An integrated circuit as claimed in claim 1, wherein the latch has a state input, a state output and a latch enable input and the latch is arranged to:
  when the latch enable input is in a first state, output at the state output a signal that represents the current value of the state input; and
  when the latch enable input is in a second state, output at the state output a signal that represents the value of the state input when the latch enable input last entered the second state; and
  the state input is connected to the output of the active circuit and the state output is connected to the pad.

6. An integrated circuit as claimed in claim 5, wherein the integrated circuit is arranged to maintain the latch enable input in the first state when the active circuit is operational, and to maintain the latch enable input in the second state when the active circuit is non-operational.

7. An integrated circuit as claimed in claim 6, wherein the integrated circuit is arranged to, when the active circuit is transitioning from an operational condition to a non-operational condition, change the latch enable input from the first state to the second state whilst the output of the active circuit remains valid.

8. An integrated circuit as claimed in claim 1, wherein the interface circuit comprises a connection between the pad and the active circuit whereby the active circuit can read the state of the pad.

9. An integrated circuit as claimed in claim 1, wherein the active circuit is capable of adopting an operational condition and a non-operational condition, and the active circuit is configured to:
  on transitioning from the operational condition to the non-operational condition, write at least a part of its operational state to the pad; and
  on transitioning from the non-operational condition to the operational condition, read the state of the pad and configure its operational state in dependence on the state of the pad.

10. An integrated circuit as claimed in claim 1, wherein the latch is capable of storing multiple data bits.

11. An integrated circuit as claimed in claim 1, wherein the integrated circuit is capable of putting the active circuit in a low power state in which it is inactive whilst the latch remains powered so as to hold the state of the pad.

12. An integrated circuit as claimed in claim 1, wherein the integrated circuit is capable of putting the active circuit in a low power state in which it is inactive whilst the latch remains powered so as to hold its state without driving the pad.

13. An integrated circuit as claimed in claim 1, wherein the active circuit signals over a first voltage range and the pad signals over a second voltage range, and the interface circuit comprises a level shifter for converting between the first and second voltage ranges, the level shifter being capable of converting a signal at a first extreme of the first range to a signal at a first extreme of the second range irrespective of whether the first extreme of the first range is higher or lower than the first extreme of the second range.

14. An integrated circuit comprising:
  an external connection pad;
  an active circuit for generating signals to be output from the integrated circuit by means of the pad, the active circuit signalling over a first voltage range and the pad signalling over at a second voltage range; and
  an interface circuit associated with the pad, the interface circuit comprising a level shifter for converting between the first and second voltage ranges, the level shifter being capable of converting a signal at a first extreme of the first range to a signal at a first extreme of the second range irrespective of whether the first extreme of the first range is higher or lower than the first extreme of the second range.

15. An integrated circuit as claimed in claim 14, further comprising a switch that receives a supply voltage of the active circuit and a supply voltage of the pad, the switch being configured to provide the higher of those voltages to the interface circuit as a supply voltage of the interface circuit.

* * * * *